United States Patent [19]
Oh

[11] Patent Number: 6,154,388
[45] Date of Patent: Nov. 28, 2000

[54] SECURITY CIRCUIT FOR SEMICONDUCTOR MEMORY AND METHOD FOR PROTECTING STORED DATA USING THE SAME

[75] Inventor: Hyung Seog Oh, Chungcheongbuk-do, Rep. of Korea

[73] Assignee: Hyundai Electronics Industries Co., Ltd., Kyoungki-do, Rep. of Korea

[21] Appl. No.: 09/283,572

[22] Filed: Apr. 1, 1999

[30] Foreign Application Priority Data

Apr. 2, 1998 [KR] Rep. of Korea ............... 98 11668

[51] Int. Cl.[7] ........................................ G11C 16/04
[52] U.S. Cl. .................. 365/185.04; 365/225.7; 365/200; 365/195
[58] Field of Search ................ 365/185.04, 225.7, 365/226, 189.11, 195, 200

[56] References Cited

U.S. PATENT DOCUMENTS

| | | | |
|---|---|---|---|
| 4,268,911 | 5/1981 | Bell | 365/104 |
| 4,606,013 | 8/1986 | Yoshimoto | 365/200 |
| 5,053,992 | 10/1991 | Gilberg et al. | 365/53 |
| 5,309,394 | 5/1994 | Wuertz et al. | 365/189.03 |

*Primary Examiner*—Richard Elms
*Assistant Examiner*—Tuan T. Nguyen

[57] ABSTRACT

A security circuit for a semiconductor memory, is disclosed, which is able to provide excellent security and safety for data stored in the memory, even if a small number of pads are available. The circuit includes a pad connected to a terminal on a memory IC for use as a write enable terminal, a fuse connected between the pad and the internal memory IC for isolating the internal memory IC from the pad after data is written on the memory IC, a low voltage detecting part for detecting a low voltage at a pad terminal, a latching part for forwarding an output of the low voltage detecting part after maintaining or inverting the output, a switching part for supplying power sufficient to the fuse in response to a signal from the latching part, a pull-up part for pulling up a voltage of the memory when the fuse is blown, and a power on reset part for initializing the latching part.

23 Claims, 3 Drawing Sheets

SECURITY CIRCUIT FOR SEMICONDUCTOR MEMORY AND METHOD FOR PROTECTING STORED DATA USING THE SAME

BACKGROUND OF THE INVENTION

1. Field of the Invention

The present invention is related to a device and method for protecting data in a semiconductor memory, and more particularly, to a security circuit for a semiconductor memory which provides excellent security and safety even with a small number of pads, and a method of protecting stored data using the same.

2. Discussion of the Related Art

In general, a semiconductor memory has a plurality of pads used as input/output terminals. One of the pads is used as a memory write enable pin. To protect data stored in the memory, a fuse is provided between the pad and the memory. The fuse is blown after data is written to the memory to prevent data from being subsequently written thereon through the pad.

A conventional security circuit for a semiconductor memory will be explained with reference to the attached drawing. FIG. 1 illustrates a conventional security circuit for a semiconductor memory.

Referring to FIG. 1, the conventional security circuit for a semiconductor memory is provided with a first pad PAD1 connected to a memory IC for use as a write enable terminal, a fuse 3 connected between the first pad PAD1 and the memory IC for isolating the inner memory IC from the first pad PAD1 after data has been written to the memory IC, a second pad PAD2 connected to the memory IC is parallel with the first pad PAD1 for applying a power after the fuse 3 is blown, an electrostatic protection part 1 having a plurality of transistors Q1–Q3 for protecting inflow of a static electricity into the inner memory IC through the second pad PAD2, and a resistor 4 for preventing floating of an isolated portion when the fuse is blown. A switching transistor Q4 is also included for switching a voltage applied to the second pad PAD2.

The operation of the conventional security circuit for a semiconductor memory will be explained hereinafter. A high level signal is applied to the first pad PAD1, which functions as a write enable terminal, for writing a data on the memory. After the data is written on the memory, when an enable signal is given to the first pad PAD1 in continuation, either the stored data is erased or other data is overwritten. Therefore, in order to prevent overwriting or erasing of data, the fuse 3 is blown by applying a high voltage to the first pad PAD1 and grounding the second pad PAD2. Once fuse 3 is blown, even if a high level signal is applied to the first pad PAD1, a memory write mode is not enabled. Furthermore, even if a high level signal is applied to the second pad PAD2, no enable signal is applied because a gate and drain of the transistor Q1 in the electrostatic protection part 1 are grounded. Thus, the data stored in an inner memory can be secured.

However, the aforementioned background art security circuit for a semiconductor memory has the following, and other, problems.

First, the security circuit is vulnerable to static electricity because no electrostatic circuit is provided to the first pad as a provision for applying a high voltage to the first pad in blowing the fuse.

Second, the conventional security circuit is difficult to incorporate into a device having a small number of pins, such as a smart card, because the conventional security circuit requires the first and second pads for blowing the fuse.

Third, the conventional security circuit has a limitation on services of the pads because signals both on the first and second pads should be the same.

SUMMARY OF THE INVENTION

The present invention is directed to a security circuit for a semiconductor memory that substantially obviates one or more of the problems due to limitations and disadvantages of the related art.

An object of the present invention is to provide a security circuit for a semiconductor memory which can provide excellent security and safety even with a small number of pins, and a method of protecting stored data using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the security circuit for a semiconductor memory includes a pad connected to a terminal on a memory IC for use as a write enable terminal, a fuse connected between the pad and the internal memory IC for isolating the internal memory IC from the pad after a data is written on the memory IC, a low voltage detecting part for detecting a low voltage at a pad terminal, a latching part for forwarding an output of the low voltage detecting part after maintaining the output the same as it was or inverting the output, a switching part for supplying power for blowing the fuse in response to a signal from the latching part, a pull-up part for pulling up a voltage of the memory when the fuse is blown, and a power on reset part for initializing the latching part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENT

Figure 1:
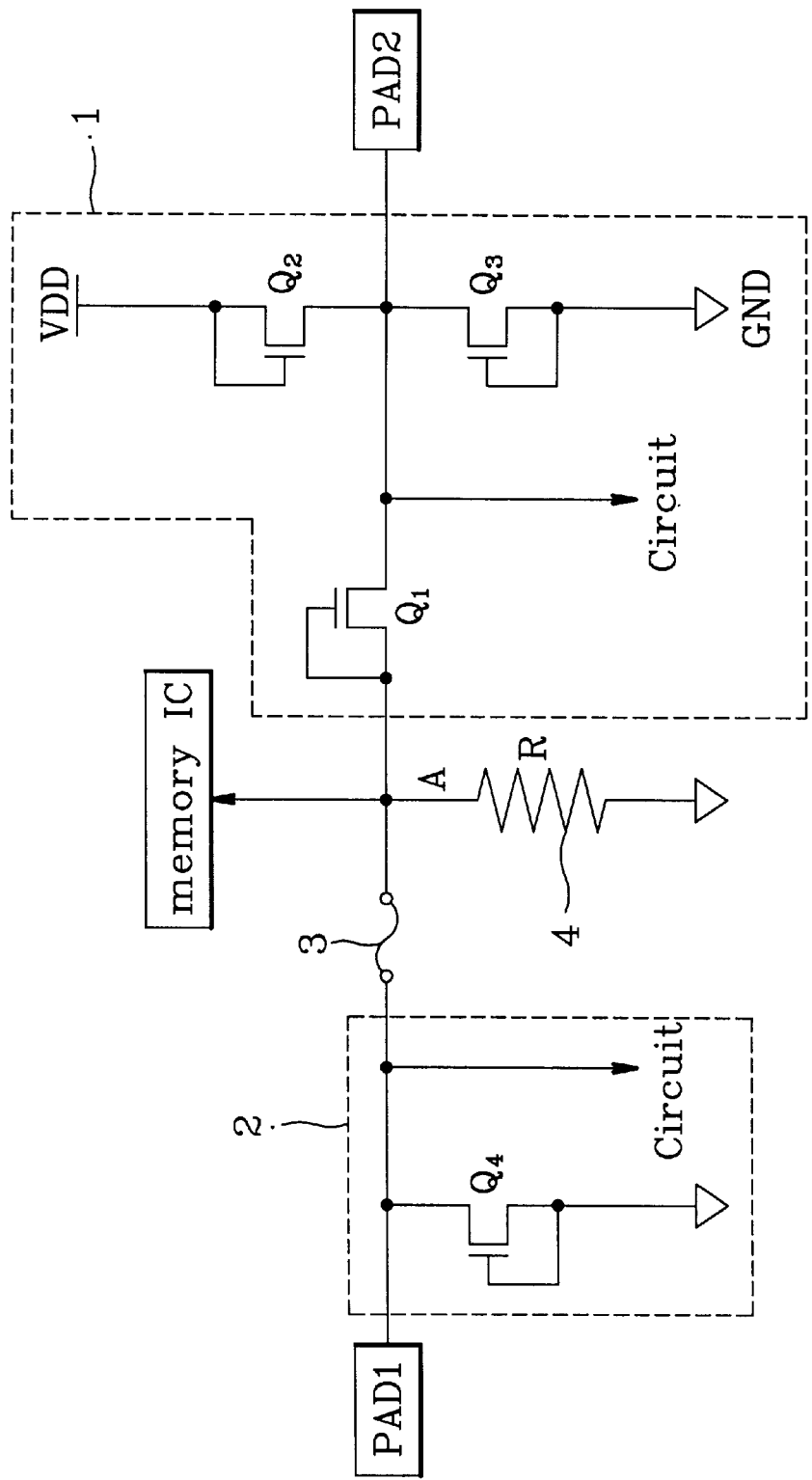
FIG. 1 illustrates a system of a conventional security circuit for a semiconductor memory.
Figure 2:
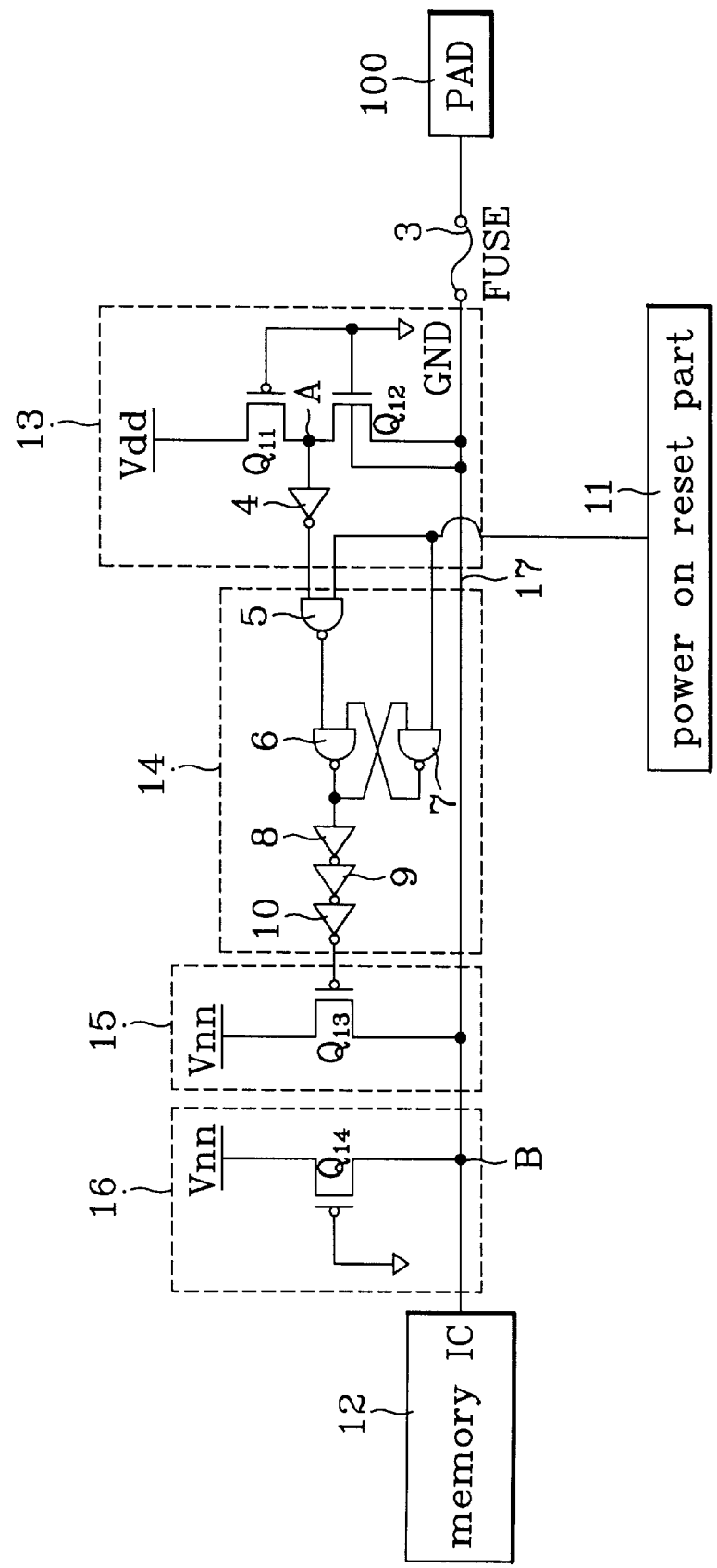
FIG. 2 illustrates a system of a security circuit for a semiconductor memory in accordance with a preferred embodiment of the present invention; and, FIG. 3 illustrates an example of output produced by power on reset part 11 within the system of the security circuit described with respect to FIG. 2.

Reference will now be made in detail to the preferred embodiments of the present invention, examples of which are illustrated in the accompanying drawings. FIG. 2 illustrates a security circuit for a semiconductor memory in accordance with a preferred embodiment of the present invention.

Referring to FIG. 2, the security circuit for a semiconductor memory in accordance with a preferred embodiment of the present invention includes a pad 100 connected to a terminal on a memory IC 12 that is used as a write enable terminal, a fuse 3 connected between the pad 100 and the memory IC 12 that is blown after data has been written to the memory IC 12 for isolating the memory IC 12 from the pad 100, a low voltage detecting part 13 having a plurality of transistors Q11 and Q12 and an inverter 4 for detecting a low voltage at the pad terminal, a latching part 14 having a plurality of NAND gates 5, 6 and 7 and a plurality of inverters 8, 9 and 10 for maintaining or inverting an output of the low voltage detecting part 13, a switching part 15 having a PMOS transistor Q13 for supplying power used to blow the fuse 3 in response to a signal from the latching part 14, a pull-up part 16 for pulling up a voltage of the memory 12 when the fuse 3 is blown, and a power on reset part 11 for initializing the latching part 14. A pad line 17 connects pad 100 with memory IC 12 unless/until fuse 3 is blown. After fuse 3 is blown, it no longer operates as a conductor for a current otherwise passing between its terminals.

The low voltage detecting part 13 includes first and second transistors Q11 and Q12, each having a gate that is grounded in common and each being connected between a power supply terminal Vdd and the pad 100 line in series, a first inverter 4 for inverting a voltage at a contact point "A" located between the first and second transistors Q11 and Q12, wherein a substrate of the second transistor Q12 and the pad line 17 are connected. A size of the first transistor Q11 is approximately ⅓ of a size of the second transistor Q12, and both the first and second transistors have a low threshold voltage.

The latching part 14 includes a first NAND gate 5 for subjecting an output of the low voltage detecting part 13 and an output of the power on reset part 11 to a logical AND operation and inversion. Latching part 14 includes second and third NAND gates 6 and 7 for receiving an output of the first NAND gate 5 and an output of the power on reset part 11, respectively, and for subjecting those outputs to a logical AND operation with an opposite output and inversion. In addition, latching part 14 includes second, third and fourth inverters 8, 9 and 10 for successively inverting an output of the second NAND gate 6.

The switching part 15 includes a PMOS transistor Q13 for applying a static voltage Vnn to the pad line 17 according to an action of an output of the latching part 14. The pull up part 16 includes a PMOS transistor Q14 having a grounded gate for applying a static voltage Vnn to the pad line 17, wherein a fine current is adapted to flow because a size of the transistor Q14 in the pull up part 16 is very small.

The operation of the aforementioned security circuit for a semiconductor device of the present invention will be explained.

The security circuit for a semiconductor device of the present invention uses one pad to apply either a 0V voltage for writing data to a memory IC and a negative voltage for blowing the fuse. That is, even though the first and second transistors Q11 and Q12 have low threshold voltages, when the power on reset part 11 provides a "low" signal and the pad 100 is used to supply a 0V voltage, the transistor Q11 is turned on and the transistor Q12 is turned off since the gates of the transistors Q11 and Q12 in the low voltage detecting part 13 have a ground voltage charged thereon. Therefore, a high level signal is provided at a contact point "A" located at a connection point between transistors Q11 and Q12, and the inverter 4 provides a low level signal. Moreover, the low voltage detecting part 13 provides a low level signal when the pad is used to supply a 0V voltage. Since the signal provided from the inverter 4 is at a low level, the NAND gate 5 in the latching part 14 provides a high level signal, and, since the signal provided from the power on reset part 11 is at a low level, the NAND gate 7 also provides a high level signal. Accordingly, the NAND gate 6 provides a low level signal, and the latching part 14 provides a high level signal as the signal from the NAND gate 6 passes through three inverters 8, 9 and 10. Switching part 15 is isolated. Therefore, when it is supplied with the high level signal from the latching part 14, the fuse 3 is not broken. Consequently, when 0V is applied to the pad 100, the memory IC 12 is enabled in a write mode, allowing data to be written thereon.

After storage of the data in the memory IC 12, the fuse 3 is blown to protect the stored data. To blow fuse 3, the power on reset part 11 must provide a high level signal and a negative voltage must be supplied by the pad 100. That is, when the power on reset part 11 provides a high level signal and the pad 100 supplies a negative voltage (e.g., less than −2V), a voltage difference between the gate and source becomes greater than 0.7V since the substrate of the transistor Q12 in the low voltage detecting part 13 is connected to the pad line 17, even if a ground voltage is applied to the gates of transistors Q11 and Q12 to turn those transistors on. However, as the size of the transistor Q11 is no greater than ⅓ of the size of transistor Q12 (that is, a current drained through the transistor Q12 to the pad 100 is greater than a current flowing from the Vdd through the transistor Q11), an output at the contact point A is at a low level, and an output of the inverter 4 is at a high level. Since the signal from the power on reset part 11 has a high level, the NAND gate 5 provide a low level signal and the NAND gate 6 provides a high level signal, regardless of the signal provided from the NAND gate 7. The NAND gate 7 provides a low level signal in response to the high level signal from power on reset part 11. And, a low level signal is provided to the switching part 15 through the three inverters 8, 9 and 10. When the low level signal is thus provided to the switching part 15, the switching part 15 is turned on, causing a large current to flow toward the pad 100 through the pad line 17 and fuse 3, blowing the fuse 3. Once the fuse 3 is blown, no memory write enable signal can be applied to the memory IC 12 from the pad 100. Thus, the voltage level at contact point B is kept "high" by the pull up part 16, causing the memory IC 12 to remain non-enabled.

Figure 3:
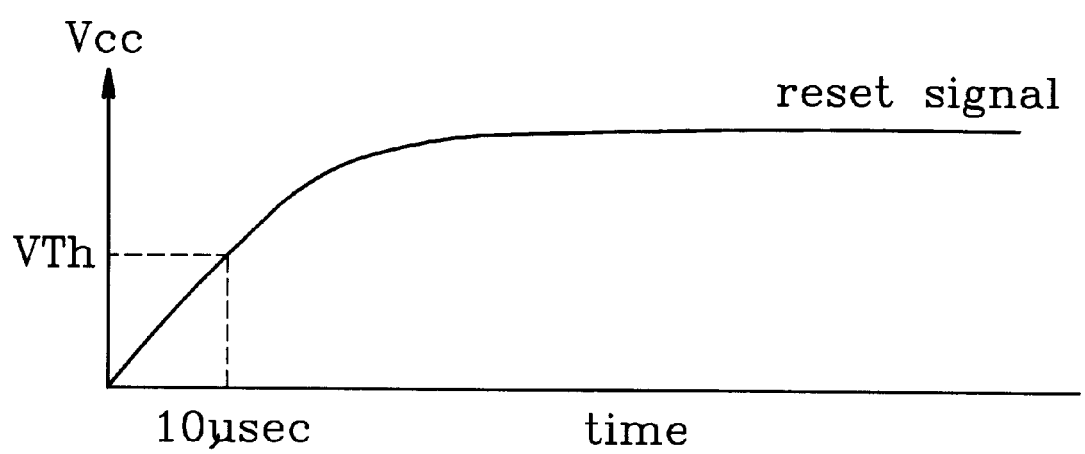

FIG. 3 illustrates one example of output provided by power on reset part 11 to blow fuse 3. As shown in FIG. 3, power on reset part 11 outputs a "low" level signal when initialized and for approximately 10 microseconds thereafter. When the power on reset part 11 outputs this low level signal, NAND gates 5 and 7 output "high" level signals and NAND gate 6 outputs a "low" level signal. Therefore, latching part 14 is initialized when power on reset part 11 outputs a low level signal.

Approximately 10 microseconds after initialization, power on reset part 11 outputs a "high" level signal that is useful in blowing fuse 3 to protect data that has been stored.

The aforementioned security circuit for a semiconductor memory of the present invention has many advantages, including the advantages discussed hereinafter.

First, since a system having a single pad can disable that pad by blowing a fuse to protect the data previously stored in the memory, the security circuit of the present invention can be applied to devices which require a high level of security and a small number of pins, such as smart card.

Second, in a semiconductor manufacturing company, as the security circuit is applicable to cases a device should be tested and a pin thereon should be broken for security, the security circuit is economical.

It will be apparent to those skilled in the art that various modifications and variations can be made in the security circuit for a semiconductor memory of the present invention without departing from the spirit or scope of the invention. Thus, it is intended that the present invention cover the modifications and variations of this invention provided they come within the scope of the appended claims and their equivalents.

What is claimed is:

1. A security circuit for a semiconductor memory, comprising:
   a pad connected to a terminal on a memory that functions as a write enable terminal;
   a fuse connected between the pad and the memory for isolating the memory from the pad after a data is written on the memory;
   a low voltage detecting part for detecting a low voltage output by the pad;
   a latching part for generating a signal based on an output from the low voltage detecting part;
   a switching part for supplying power for blowing the fuse in response to a signal from the latching part; and
   a power on reset part for initializing the latching part.

2. A security circuit as claimed in claim 1, wherein the low voltage detecting part includes,
   first and second transistors connected in series between a power terminal and a pad line and having gates grounded in common, and
   a first inverter for inverting a voltage at a contact point of the first, and second transistors.

3. A security circuit as claimed in claim 2, wherein a substrate of the second transistor and a pad line is connected.

4. A security circuit as claimed in claim 2, wherein a size of the first transistor is one thirds of a size of the second transistor.

5. A security circuit as claimed in claim 1, wherein the latching part either maintains or inverts the output from the low voltage detecting part based on an output from the power on reset part.

6. A security circuit as claimed in claim 5, wherein the latching part includes:
   a first gate for subjecting an output of the low voltage detecting part and an output of the power on reset part to a logical NAND operation,
   second and third gates for receiving an output of the first gate and an output of the power on reset part, respectively, and for performing a logical NAND operation between the output of the first gate and the output of the third gate and between the output of the power on reset part and an output of the second gate, and
   multiple inverters for successively inverting an output of the second gate.

7. A security circuit as claimed in claim 1, wherein the switching part includes a transistor for applying a static voltage to a pad line connected to the pad through the fuse and to the memory according to an output of the latching part.

8. A security circuit as claimed in claim 1, further comprising:
   a pull-up part for pulling up a voltage of the memory when the fuse is blown.

9. A security circuit as claimed in claim 8, wherein the pull-up part includes a transistor having a grounded gate for applying a static voltage to a pad line connected to the memory.

10. A security circuit as claimed in claim 1, wherein the pad is a single pad and wherein no other pads are included in the security circuit.

11. A security circuit for a semiconductor memory, comprising:
    a pad connected to a terminal on a memory that functions as a write enable terminal;
    a fuse connected to the pad and the memory for isolating the memory from the pad after data is written on the memory;
    a switch connected to the fuse for supplying a sufficient amount of power to blow the fuse based on a low level signal generated by the pad; and
    a pull-up part for pulling up a voltage of the memory after the fuse is blown.

12. The security circuit of claim 11, wherein the switch includes:
    a low voltage detecting part for detecting a low voltage output by the pad;
    a latching part for generating a signal based on an output from the low voltage detecting part; and
    a switching part for supplying power for blowing the fuse in response to a signal from the latching part.

13. The security circuit of claim 12, further comprising:
    a power on reset part for initializing the latching part,
    wherein the signal generated by the latching part is either the output from the low voltage detecting part or an inversion thereof depending on an output from the power on reset part.

14. A method of protecting data written into memory from erasure or overwriting, comprising:
    detecting a particular voltage level output from a pad that is connected to a memory for supplying a write enable signal to the memory;
    supplying power to blow a fuse connecting the pad to the memory when a low level voltage output is detected after data has been written to the memory; and
    pulling-up a voltage of the memory once the fuse is blown.

15. A security circuit for a semiconductor memory comprising:
    a single pin, connected to said memory, allowing writing of data into said memory;
    a fuse connected between said single pin and said memory;
    a voltage detector to detect an output voltage on said single pin;
    a current generator to apply a current to disable said fuse in accordance with said detected output voltage.

16. The security circuit of claim 15, wherein said voltage detector responds to a supply voltage and said output voltage, to output a signal to the current generator.

17. The security circuit of claim 16, wherein said current generator responds to a supply voltage, a power reset voltage, and said voltage detector output signal.

18. A method of protecting data written into a semiconductor memory comprising:

writing data into said memory from a single pin;

disabling a fuse connected between said single pin and said memory when a predetermined voltage output is detected on said single pin; and isolating said memory once said fuse is disabled.

19. The method of claim 18, wherein said disabling step comprises applying a predetermined current.

20. The method of claim 18, wherein said isolating step comprises adjusting a voltage applied to said memory.

21. A method of protecting data written into a semiconductor memory comprising:

applying, to a pin, a first voltage to write data into said memory; and applying, to the pin, a second voltage to disable a fuse connected between said pin and said memory without grounding any other pins connected with said memory; and isolating said memory once said fuse is disabled.

22. The method of claim 21, wherein said second voltage is lower than said first voltage.

23. The method of claim 22, wherein said second voltage is negative and said first voltage equals zero.

* * * * *